United States Patent
Mitsuyoshi

(10) Patent No.: US 7,704,031 B2
(45) Date of Patent: Apr. 27, 2010

(54) SUBSTRATE PROCESSING APPARATUS

(75) Inventor: Ichiro Mitsuyoshi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 247 days.

(21) Appl. No.: 10/813,323

(22) Filed: Mar. 29, 2004

(65) Prior Publication Data

US 2004/0191046 A1 Sep. 30, 2004

(30) Foreign Application Priority Data

Mar. 28, 2003 (JP) ............................... 2003-090576

(51) Int. Cl.
*H01L 21/677* (2006.01)
(52) U.S. Cl. ................... 414/217; 414/217.1; 414/281; 414/940
(58) Field of Classification Search .............. 414/217.1, 414/940, 217, 281
See application file for complete search history.

(56) References Cited

U.S. PATENT DOCUMENTS

| | | | | |
|---|---|---|---|---|
| 5,478,195 | A * | 12/1995 | Usami | ......................... 414/805 |
| 5,645,419 | A | 7/1997 | Ohsawa et al. | |
| 6,032,083 | A | 2/2000 | Oosawa | |
| 6,283,692 | B1 * | 9/2001 | Perlov et al. | ............ 414/222.01 |
| 6,439,822 | B1 * | 8/2002 | Kimura et al. | ......... 414/331.04 |
| 6,447,232 | B1 * | 9/2002 | Davis et al. | ............... 414/217.1 |
| 6,736,582 | B1 * | 5/2004 | Mages et al. | .................. 414/217 |
| 2002/0090284 | A1 * | 7/2002 | Mages et al. | .................. 414/411 |
| 2002/0141850 | A1 * | 10/2002 | Yamada | .................... 414/217.1 |

FOREIGN PATENT DOCUMENTS

| | | |
|---|---|---|
| JP | 63-17706 | 1/1988 |
| JP | 06-244268 | 9/1994 |
| JP | 2002-231785 | 8/2002 |

OTHER PUBLICATIONS

Definition of "mechanism" from http://www.thefreedictionary.com.*
Definition of "mechanism" from http://www.thefreedictionary.com; this was printed on Jun. 16, 2009 and replaces prior 892. The image of this definition is already scanned and was mailed Jun. 18, 2009 and the 892 is updated just to add the date the NPL reference was printed to the 892.*

* cited by examiner

*Primary Examiner*—Michael S Lowe
(74) *Attorney, Agent, or Firm*—Ostrolenk Faber LLP

(57) ABSTRACT

When FOUPs (front opening unified pods) (80*a*, 80*b*) are mounted on shelves (111*d*, 121*c*), respectively, shelves (121*a*, 121*b*, 121*c*) are moved in the vertical direction by cylinders (127*a*, 127*b*, 127*c*), respectively. The FOUP (80*b*) is thereby moved above the FOUP (80*a*) to create a space (129), for ensuring a transport path (AR6) for the FOUP (80*a*). The FOUP 80*a* can therefore be transported to a shelf (141) without moving the FOUP (80*b*) to another shelf, achieving improved throughput of substrate processing.

4 Claims, 11 Drawing Sheets

F I G . 6
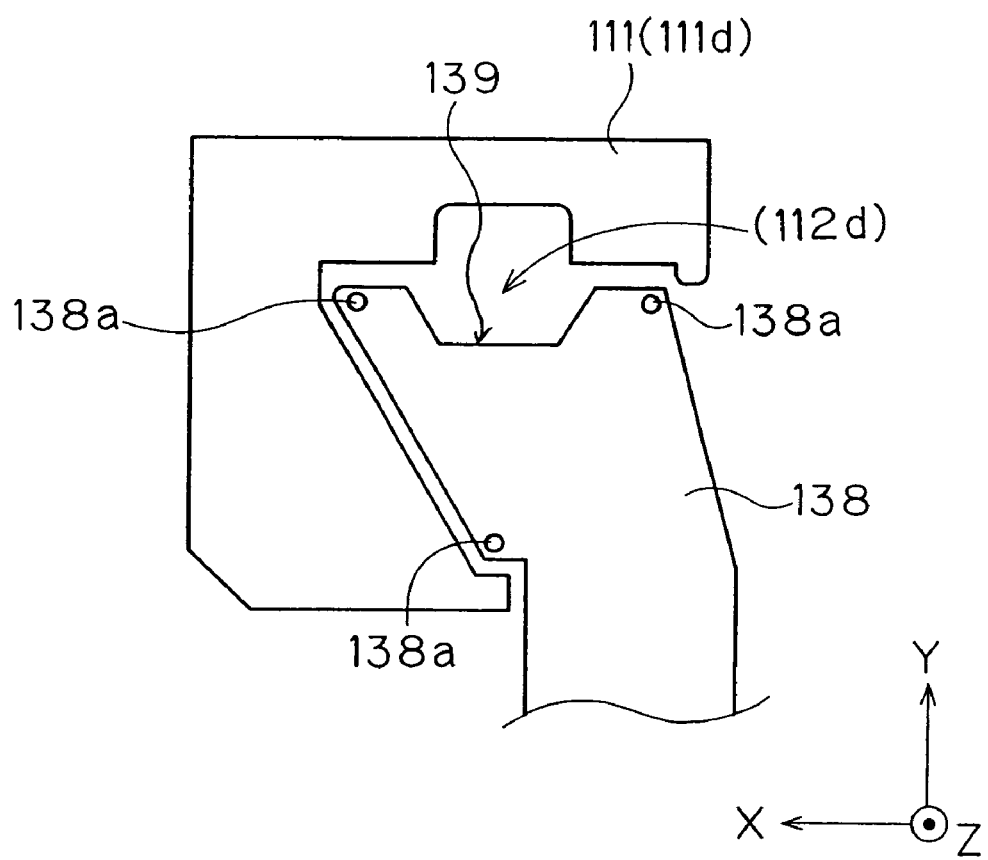

SUBSTRATE PROCESSING APPARATUS

BACKGROUND OF THE INVENTION

1. Field of the Invention

The present invention relates to techniques for receiving a container for storing semiconductor substrates (or wafers), glass substrates for LCD devices, glass substrates for photomasks, substrates for optical disks (hereinafter referred to as "substrates"), and for transporting the substrates into and out of the container. It particularly relates to improvements in effectively transporting the container without an increase in footprint of a substrate transfer unit.

2. Description of the Background Art

Conventionally, unprocessed substrates stored in carriers are transported from outside into a substrate processing apparatus for performing a surface preparation such as an etching process on substrates. The carriers include an OC (open cassette) of the type in which part of the container thereof is open to the outer atmosphere, and a FOUP (front opening unified pod) of the type in which the container thereof is enclosed or sealed.

When the FOUP-type cassette (hereinafter simply referred to as a "FOUP") is used to transport substrates between apparatuses, the substrates are transported while being enclosed in the FOUP. Thus, the cleanliness of the substrates is maintained even if particles and the like are present in the ambient atmosphere. This eliminates the need to raise so high the cleanliness in a cleanroom in which the substrate processing apparatus is installed, thereby reducing costs required for the cleanroom.

However, in the case where FOUPs are respectively mounted on adjacent two shelves located at substantially the same height in a loader, a conventional apparatus cannot transport the FOUP mounted on the further one of the shelves with respect to an opener from that shelf to a predetermined position without momentarily moving the FOUP mounted on the nearer one of the shelves with respect to the opener to another shelf.

With the FOUPs respectively mounted on the adjacent two shelves, moving the FOUP mounted on the further one of the shelves with respect to the opener to a predetermined shelf requires the time to move the FOUP mounted on the nearer one of the shelves with respect to the opener in addition to the time to move the FOUP mounted on the further one of the shelves. This disadvantageously results in decrease in throughput of substrate processing in the whole apparatus.

Among substrate processing apparatuses for solving the above problem is one that includes a loader 900 as shown in FIGS. 9 to 11. FIG. 9 is a front view and FIG. 10 is a top view of the loader 900, respectively. As shown in FIGS. 9 and 10, the loader 900 mainly includes shelves 911 to 917 and a transport robot 930 for transporting FOUPs 980 among the shelves 911 to 917.

The shelves 911 to 917 are each intended to mount and hold a FOUP 980 on its upper surface, and are arranged vertically and horizontally in an inner space of the loader 900. A transport mechanism not shown transports FOUPs 980 from outside into the loader 900 so that they are stored in the loader 900.

The transport robot 930 is mainly provided with a support 931, a horizontal driver 935 and a transport arm 938.

The bottom of the support 931 is connected to the horizontal driver 935 moving on a rail member 934 in the direction of an arrow AR2. The transport arm 938 moving upwardly/downwardly in the direction of an arrow AR1 parallel to the Z axis is attached to the support 931. As shown in FIG. 10, the transport arm 938 is movable back and forth in the direction of an arrow AR3, and can support the FOUP 980 at its leading edge 938a (FIG. 10). As described, the transport robot moves the FOUP 980 in the respective directions of the arrows AR1 to AR3 while supporting the FOUP 980 at the leading edge 983a thereof.

Even in the case where the FOUPs 980 are respectively mounted on the shelves 911 and 914 as shown in FIG. 11, the FOUP 980 mounted on the shelf 911 is transported by the transport robot 930 along a transport path indicated by an arrow AR4 to be mounted on the shelf 917. That is, the FOUP 980 mounted on the shelf 911 can be transported directly to a predetermined shelf (917 in the case of FIG. 11) while detouring around the shelf 914 without moving the FOUP 980 mounted on the shelf 914 to another place as in the conventional apparatus.

In this case, however, it is necessary to ensure the transport path for transporting the FOUP 980 while detouring as indicated by the arrow AR4. Therefore, the depth of the loader 900 along the Y axis increases along the Y axis by the size D2 equal to or greater than the size D1 of the FOUP 980 along the Y axis. As a result, the use of the loader 900 solves the problem of decrease in throughput of the apparatus as a whole. However, another problem arises in that the footprint of the substrate processing apparatus (area occupied by the apparatus) as a whole increases by a region 970. Substrate processing apparatuses are generally installed in a cleanroom, and an increase in footprint of one substrate processing apparatus is not desirable in a cleanroom which requires considerable costs for maintaining an atmosphere.

SUMMARY OF THE INVENTION

The present invention is intended for a substrate processing apparatus.

According to the present invention, the substrate processing apparatus comprises: a substrate processing unit for performing a predetermined process on a substrate; and a substrate transfer unit for holding a container for storing a substrate therein and transferring the substrate stored in the container to the substrate processing unit. The substrate transfer unit includes: a mounting part for mounting the container thereon to transfer the substrate stored in the container to the substrate processing unit; a first shelf line containing a plurality of first shelves arranged in the vertical direction at a first predetermined interval, each being capable of mounting the container thereon; a second shelf line provided between the mounting part and the first shelf line and containing a plurality of second shelves arranged in the vertical direction at a second predetermined interval, each being capable of mounting the container thereon; a displacing element for displacing at least one of a target one of the plurality of first shelves in the first shelf line and a corresponding one of the plurality of second shelves relative to the other in the vertical direction, thereby ensuring a container transport path of a height greater than the second predetermined interval in the second shelf line; and a transport element for transporting the container mounted on the target one of the plurality of first shelves to the mounting part in the horizontal direction along the container transport path created by the displacing element while holding the container.

A container mounted on a target one of the first shelves can be transported by the transport element in the horizontal direction along the container transport path without moving a container, if any, mounted on one of the second shelves. This can reduce the time required for transporting a container, leading to reduction in processing time required for substrate processing as a whole, which can achieve improved throughput of substrate processing.

Preferably, the displacing element includes a plurality of displacing mechanisms connected to at least part of the plurality of second shelves for displacing the at least part of the plurality of second shelves in the vertical direction.

The at least part of the plurality of second shelves can be displaced in the vertical direction without moving a target one of the first shelves, so that the container mounted on the target shelf can be transported.

Preferably, the displacing element includes a plurality of displacing mechanisms connected to the plurality of second shelves, respectively, each being capable of displacing a corresponding one of the plurality of second shelves individually in the vertical direction.

Those of the second shelves necessary for ensuring the transport path can be moved in the vertical direction. This can reduce the time required for ensuring the transport path.

According to one aspect of the present invention, the substrate processing apparatus comprises: a substrate processing unit for performing a predetermined process on a substrate; and a substrate transfer unit for holding a container for storing a substrate therein and transferring the substrate stored in the container to the substrate processing unit. The substrate transfer unit includes: a mounting part for mounting the container thereon to transfer the substrate stored in the container to the substrate processing unit; a two-dimensional array of shelves where a plurality of shelves each being capable of mounting the container thereon are arranged in a matrix in the vertical and horizontal directions, the two-dimensional array of shelves having at least one shelf-less part on the side of the mounting part; a displacing element for displacing at least one of the plurality of shelves in the two-dimensional array of shelves in the vertical direction, thereby moving the shelf-less part; and a transporting element for transporting the container to the mounting part in the horizontal direction through the shelf-less part moved by the displacing element while holding the container.

A container, if any, mounted on a shelf horizontally adjacent to a target shelf on which a container to be transported is mounted does not need not be moved to another place. This can reduce the time required for transporting a container, leading to reduction in processing time required for substrate processing as a whole, which can achieve improved throughput of substrate processing.

It is therefore an object of the present invention to provide a substrate processing apparatus capable of reducing the time required for transporting a container mounted on a shelf in a substrate transfer unit without an increase in footprint of the substrate transfer unit.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a top view illustrating the positional relationship between a shelf and a transport arm according to the first preferred embodiment;

DESCRIPTION OF THE PREFERRED EMBODIMENTS

1. First Preferred Embodiment

<1.1. Construction of Substrate Processing Apparatus>

Figure 1:
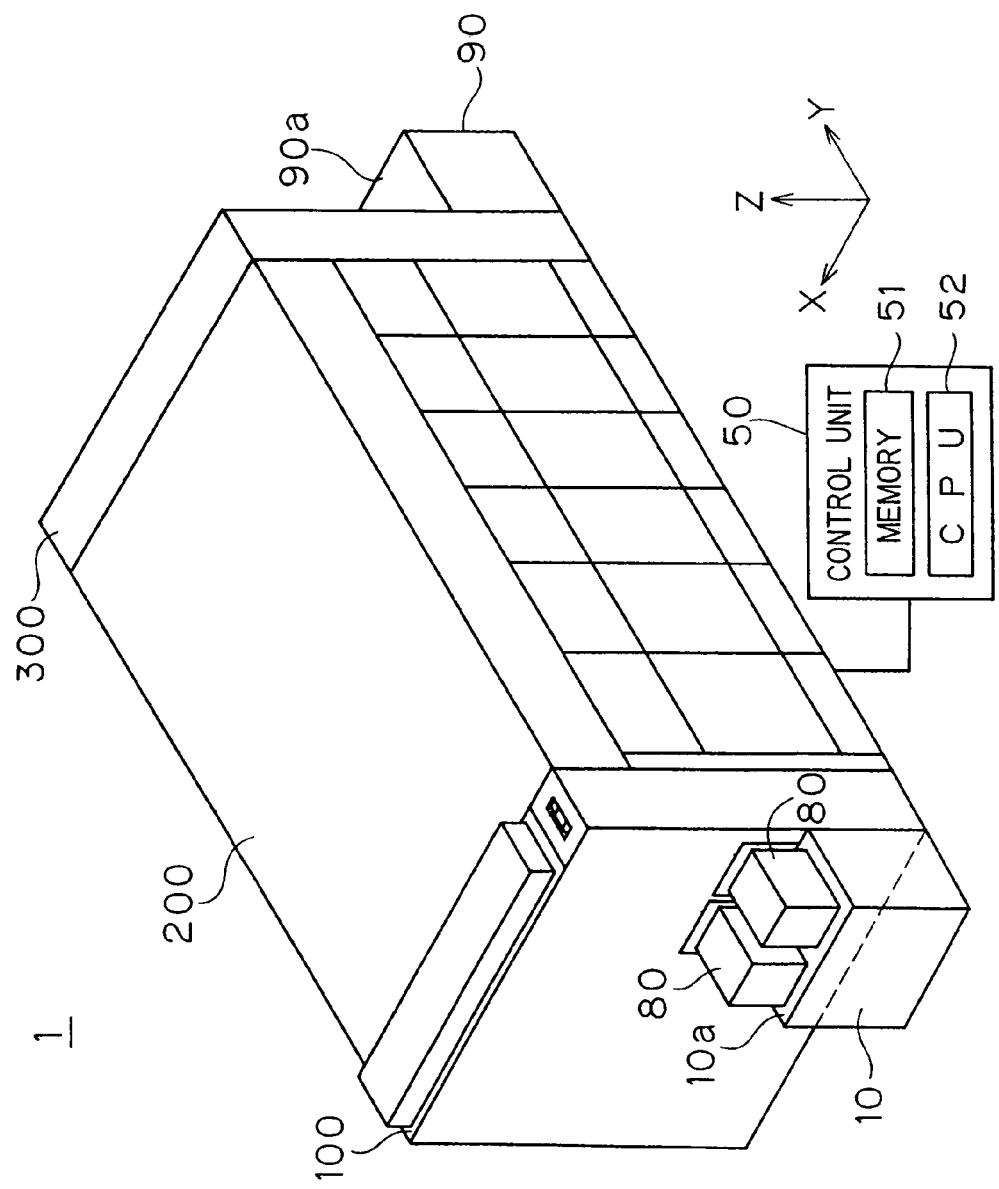
FIG. 1 is a perspective view illustrating the overall construction of a substrate processing apparatus according to a first preferred embodiment of the present invention.

FIG. 1 is a perspective view illustrating the overall construction of a substrate processing apparatus 1 according to the present invention. For the sake of definiteness of directions relative to each other, FIG. 1 and its subsequent figures include an XYZ rectangular coordinate system, as required, which defines the direction of the Z axis as the vertical direction and the X-Y plane as the horizontal plane.

The substrate processing apparatus 1 is intended to sequentially perform an etching process using a liquid chemical such as hydrofluoric acid, a rinsing process using pure water, and other processes upon a set of substrates (or a lot). As shown in FIG. 1, the substrate processing apparatus 1 mainly includes a loader 100, a load port 10 for transporting a FOUP 80 into and out of the loader 100, a substrate processing unit 200, an unloader 300 and a load port 90 for transporting the FOUP 80 into and out of the unloader 300.

Figure 2:
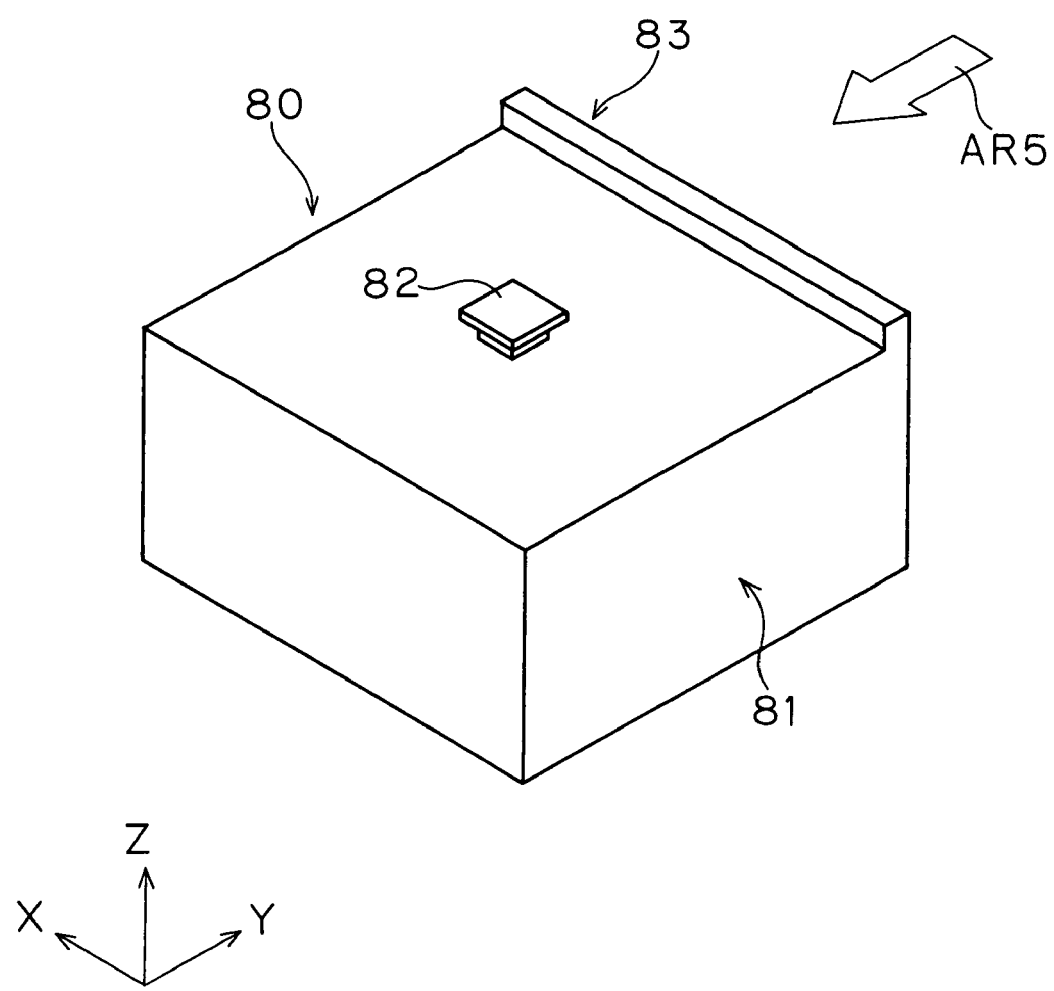
FIG. 2 is a perspective view illustrating the construction of a FOUP according to the first preferred embodiment.

The FOUP will be described. FIG. 2 is an external view, in perspective, of the FOUP. The FOUP 80 has an enclosure 81 and a flange 82 formed on the top portion of the enclosure 81. The FOUP 80 is held suspended with the flange 82 being grasped by a holding mechanism not shown. A cover 83 has a lock mechanism for locking the enclosure 81. Functioning the lock mechanism, with the cover 83 attached to the enclosure 81, secures the cover 83 to the enclosure 81 to provide a closed space enclosed in the enclosure 81. Releasing the lock mechanism allows the cover 83 to be removed from the enclosure 81. With the cover 83 removed from the enclosure 81 to open the FOUP 80, substrates may be removed out of and inserted into the enclosure 81. For example, 25 or 13 substrates are respectively stored in the enclosure 81 in the horizontal direction.

In general, when the FOUP 80 is transported inside and outside the loader 100, the cover 83 is attached to the enclosure 81 with the lock mechanism functioning or with the enclosed space provided in the enclosure 81. This maintains a high cleanliness in the FOUP 80 irrespective of the cleanliness in the cleanroom in which the substrate processing apparatus 1 is installed.

The substrate processing unit 200 has a liquid chemical bath for storing the liquid chemical and a rinsing bath for storing the pure water. Substrates transferred from the loader 100 to the substrate processing unit 200 are stored in the liquid chemical bath and rinsing bath for undergoing predetermined substrate processing such as a cleaning process.

The load port 10 is a unit arranged in parallel to the loader 100, and the FOUP 80 is transported between the load port 10 and loader 100. As shown in FIG. 1, two FOUPs 80 are mounted at the same time on a mounting surface 10a which is the top surface of the load port 10.

When a FOUP 80 with unprocessed substrates stored therein not yet subjected to the predetermined substrate processing in the substrate processing apparatus 1 is mounted on the mounting surface 10a, a transport mechanism (not shown) provided for the load port 10 transports the FOUP 80 with the unprocessed substrates stored therein from the mounting surface 10a into the loader 100. The transport mechanism provided for the load port 10 also transports an empty FOUP 80 out of which substrates have been removed to the load port 10 out of the loader 100.

The load port 90 is a unit having a similar hardware structure as the load port 10, and is arranged in parallel to the unloader 300 as shown in FIG. 1. Similarly to the load port 10, two FOUPs 80 are mounted at the same time on a mounting surface 90a which is the top surface of the load port 90.

When an empty FOUP 80 with no substrate stored therein is mounted on the mounting surface 90a, a transport mechanism (not shown) provided for the load port 90 transports the empty FOUP 80 from the load port 90 into the unloader 300. When processed substrates having undergone the predetermined substrate processing are transferred from the substrate processing unit 200 into the unloader 300 and are stored in a FOUP 80, the FOUP 80 with the processed substrates stored therein is transported out of the unloader 300 to the load port 90.

As shown in FIG. 1, the loader 100 is interposed between the load port 10 and substrate processing unit 200, and is used to momentarily hold therein the FOUP 80 transported from the load port 10 and to transfer substrates stored in the FOUP 80 to the substrate processing unit 200. The unloader 300 is interposed between the load port 90 and substrate processing unit 200, and is used to receive processed substrates having undergone the predetermined substrate processing in the substrate processing unit 200 to store them in an empty FOUP 80.

As described, in the substrate processing apparatus 1, a set of substrates (or a lot) stored in the FOUP 80 is transferred from the loader 100 to the substrate processing unit 200, and upon completion of substrate processing, is transferred from the substrate processing unit 200 to the unloader 300. Therefore, the loader 100 and unloader 300 are used as substrate transfer units for transferring substrates into and out of the substrate processing unit 200 in the substrate processing apparatus 1.

A control unit 50 has a memory 51 for storing therein programs, variables and the like, and a CPU 52 for exercising control in accordance with the programs stored in the memory 51. The CPU 52 follows the programs stored in the memory 51 to control upward/downward movement of the shelf 121 by an air cylinder (hereinafter simply referred to as a "cylinder") 127 (FIGS. 4 and 5), transport of the FOUP 80 by a transport robot 130, and the like, with predetermined timing.

<1.2. Construction of Substrate Transfer Unit>

Figure 3:
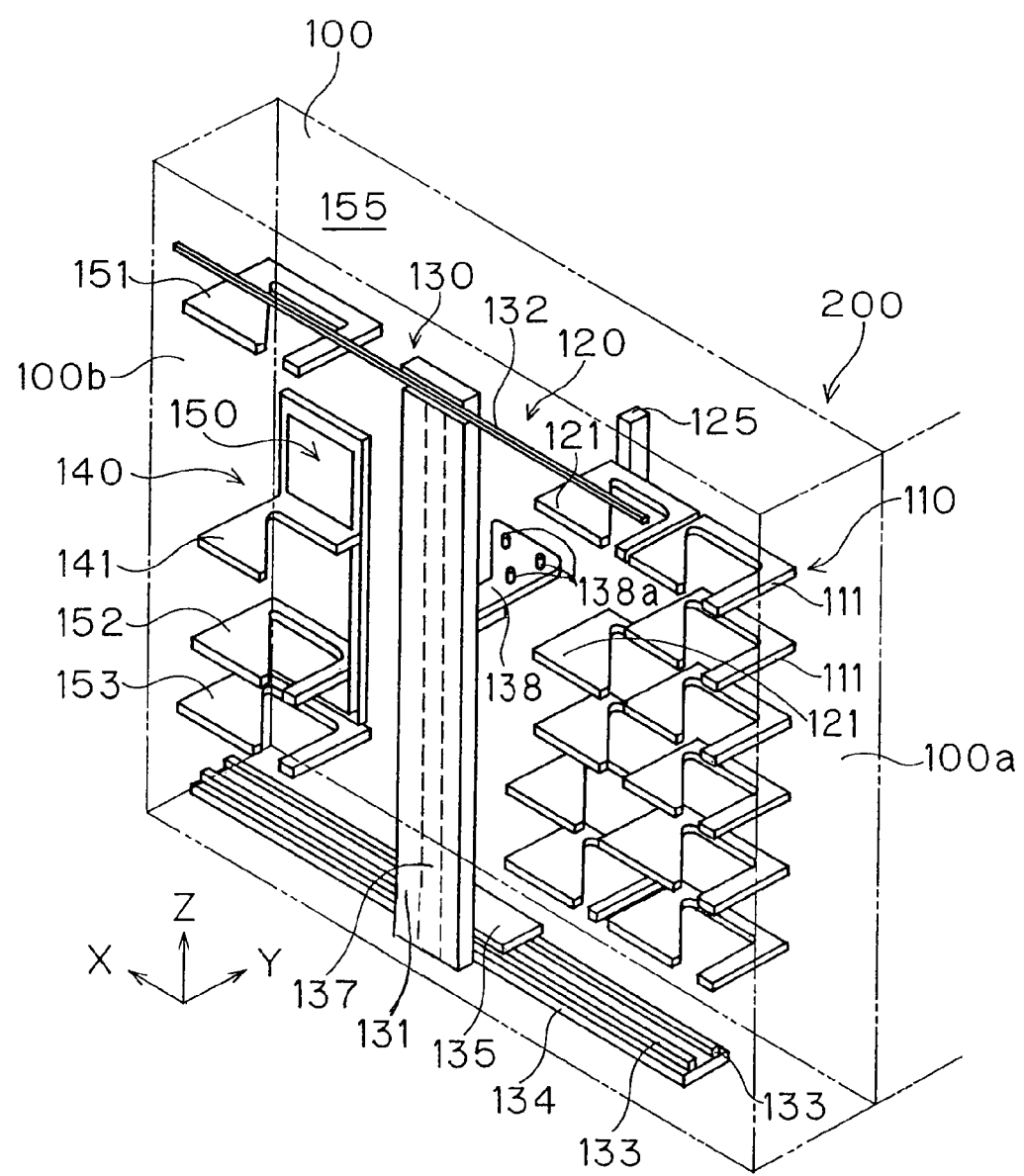
FIG. 3 is a perspective view illustrating the construction of a loader according to the first preferred embodiment.
Figure 4:
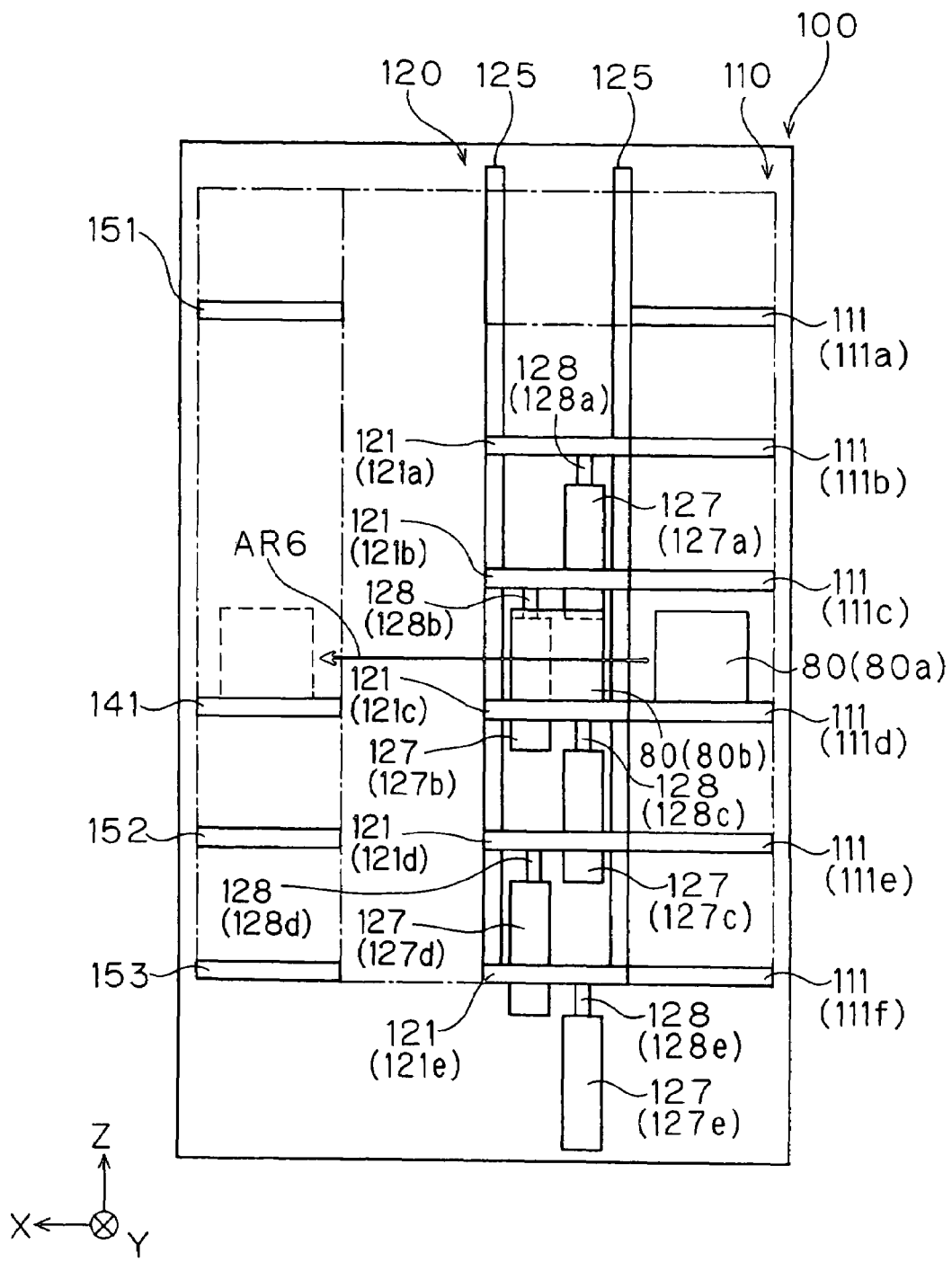
FIGS. 4 and 5 are front views illustrating the construction of receiving sections according to the first preferred embodiment.

FIG. 3 is a perspective view illustrating the construction of the loader 100 according to the present embodiment. FIG. 4 is a front view illustrating the construction of first and second receiving sections 110 and 120 according to the preferred embodiments of the present invention. The loader 100 and unloader 300 used as substrate transfer units will be described in detail. As described, the loader 100 and unloader 300 have the same construction since both of them transfer substrates into and out of the substrate processing unit 200. Therefore, the loader 100 will hereinafter be described in detail.

As shown in FIG. 3, the loader 100 mainly includes the first and second receiving sections 110 and 120 each receiving a plurality of FOUPs 80 in the vertical direction (or along the Z axis), and the transport robot 130 for transporting the FOUPs 80 stored in the first and second receiving sections 110 and 120.

As shown in FIGS. 3 and 4, the first receiving section 110 has a group of shelves (first shelf line) constituted by a plurality of (in the present embodiment, six) shelves 111 (111a to 111f) stacked in a line in the vertical direction (or along the Z axis), and is arranged in the vicinity of the right side surface 100a of the loader 100 as viewed from the load port 10 (or the opposite side of the substrate processing unit 200).

The shelves 111 are each intended for holding a FOUP 80 on its upper surface, and are attached fixedly to a partition 155 on the side of the substrate processing unit 200. The interval among the shelves 111 is set to be at least greater than the height of the FOUP 80. Each of the shelves 111 is capable of receiving one FOUP 80 to be placed thereon. It should be noted that each of the shelves 111 can receive either of the FOUP 80 with unprocessed substrates stored therein and the empty FOUP 80 out of which substrates have been removed.

As shown in FIGS. 3 and 4, the second receiving section 120 has a group of shelves (second shelf line) constituted by a plurality of (in the present embodiment, five) shelves 121 (121a to 121e) stacked in a line in the vertical direction (or along the Z axis), and is provided on the opposite side of the side surface 100a with respect to the first receiving section 110, i.e., between the first receiving section 110 and an opener 140 along the X axis. Each of the shelves 121 is capable of receiving one FOUP 80 to be placed thereon. It should be noted that each of the shelves 121 can receive either of the FOUP 80 with unprocessed substrates stored therein and the empty FOUP 80 out of which substrates have been removed.

As shown in FIG. 4, each of the shelves 121 has its bottom vertically connected to the cylinder 127 to be moved upwardly/downwardly via movable parts 128 (128a to 128e) which is extensible at least by the length equal to or greater than the height of the FOUP 80. Therefore, the amount of vertical displacement of each of the shelves 121 is set to be at least equal to or greater than the height of the FOUP 80, i.e., substantially equal to the interval among the shelves 111 in the vertical direction.

Further, each of the shelves 121 is movable slidably on a pair of guide rails 125 in the vertical direction (or along the Z axis). The interval among the shelves 121 is set to be at least greater than the height of the FOUP 80.

Therefore, air pressure within the air cylinder 127 is adjusted to move the corresponding movable part 128 upwardly/downwardly, thereby moving each of the shelves 121 individually in the vertical direction (or along the Z axis) to displace the shelves 121 in the vertical direction.

That is, the guide rails 125 and cylinder 127 connected to the bottom of each of the shelves 121 serve as a displacing mechanism for displacing at least part of the plurality of shelves 121 in the vertical direction. In other words, each of the shelves 121 of the second receiving section 120 momentarily mount the FOUP 80 thereon until transported to a predetermined shelf while moving the FOUP 80 mounted on each of the shelves 121 upwardly/downwardly.

The number of shelves 121 of the second receiving section 120 (in the present embodiment, five) is less by one than that of the shelves 111 of the first receiving section 110 (in the present embodiment, six). Accordingly, each of the shelves 121 is moved upwardly/downwardly by the corresponding cylinder 127 to individually move on the guide rails 125. The shelves 121 are thereby located such that none of the shelves 121 is at substantially the same height as one of the shelves 111 from which the FOUP 80 is to be transported.

Further, as described above, the cylinder 127 connected to the bottom of each of the shelves 121 has an amount of displacement substantially equal to the interval among the shelves 111 of the first receiving section 110. Accordingly, the uppermost shelf 121a of the second receiving section 120 moves between the positions of the shelves 111a and 111b of the first receiving section 110, while the lowermost shelf 121e of the second receiving section 120 moves between the positions of the shelves 111e and 111f of the first receiving section 110. Therefore, the shelves 121 of the second receiving section 120 move upwardly/downwardly within the height of the shelves 111 of the first receiving section 110, i.e., between the positions the shelves 111a and 111f.

The present embodiment has described that the cylinder 127 is used to move the corresponding one of the shelves 121 in the vertical direction, however, the present invention is not limited thereto, but various publicly-known mechanisms such as a feed screw mechanism with a ball screw used therein may be employed.

Further, as shown in FIGS. 3 and 4, in the vicinity of the left side surface 100b of the loader 100 as viewed from the load port 10 (i.e., the opposite side of the substrate processing unit 200), a shelf 151, opener 140, shelves 152 and 153 are provided in top-to-bottom order in the vertical direction (or along the Z axis).

The shelves 151 to 153 are attached fixedly to the partition 155 similarly to the shelves 111 contained in the first receiving section 110. Each of the shelves 151 to 153 is capable of receiving one FOUP 80 to be placed thereon. It should be noted that each of the shelves 151 to 153 can receive either of the FOUP 80 with unprocessed substrates stored therein and the empty FOUP 80 out of which substrates have been removed.

The opener 140 is used to transfer unprocessed substrates stored in the FOUP 80 into the substrate processing unit 200, and is provided between the shelves 151 and 152 arranged in the vertical direction (or along the Z axis). When the FOUP 80 with unprocessed substrates stored therein is mounted on a shelf 141 of the opener 140 by the transport robot 130 which will be described later, the opener 140 removes the cover 83 of the FOUP 80 and transfers the unprocessed substrates out of the FOUP 80 to the substrate processing unit 200 through an opening 150.

The transport robot 130 is a robot for transporting the FOUP 80 between arbitrary two shelves among the shelves 111 (111a to 111f), shelves 121 (121a to 121e), shelves 151 to 153, and shelf 141 of the opener 140, and mainly includes a support 131, a horizontal driver 135 and a transport arm 138.

The transport arm 138 is an arm for transporting the FOUP 80 while supporting it. As shown in FIG. 6, a plurality of (in the present embodiment, three) support pins 138a are provided upright on the top surface of a holding part 139 of the transport arm 138. The transport arm 138 supports the FOUP 80 with the plurality of support pins 138a fitted into corresponding holes (not shown) provided on the rear (or lower) surface of the FOUP 80. Further, the transport arm 138 is movable slidably in the vertical direction (or along the Z axis) on a rail 137 provided fixedly on the support 131 substantially in parallel to the Z axis.

As shown in FIG. 3, the support 131 is a member extending in the vertical direction, and the upper end of the support 131 is movable slidably on a guide rail 132 extending along the X axis. The support 131 has its bottom connected to the horizontal driver 135.

The horizontal driver 135 is movable on a rail member 134 along the X axis (or in the horizontal direction), and movable slidably on two rails 133 extending along the X axis (or in the horizontal direction) on the rail member 134 provided at the lower part within the loader 100, as shown in FIG. 3. Accordingly, the horizontal driver 135 moves on the two rails 133 along the X axis with respect to the first and second receiving sections 110 and 120. Therefore, the support 131 moves on the guide rail 132 along the X axis (or in the horizontal direction) as the horizontal driver 135 moves along the X axis.

Since the transport arm 138 is movable slidably on the rail 137 along the Z axis (or in the vertical direction), the transport robot 130 transports the FOUP 80 in the X-Z plane within the loader 100.

In other words, the transport robot 130 can get access to any one of the shelves 111, 121, 151 to 153, and 141. At the time when the control unit 50 (FIG. 1) selects the shelf on which the FOUP 80 to be transported is placed and the shelf to which the FOUP 80 is to be transported, the transport robot 130 transports the FOUP 80 in the vertical and horizontal directions while supporting the FOUP 80.

<1.3. Process of Transporting FOUP>

Referring now to the case in which FOUPs 80 (80a, 80b) are mounted on the shelf 111d of the first receiving section 110 and shelf 121c of the second receiving section 120, respectively, as shown in FIG. 4, and which the shelf 111d is selected as a target shelf on which the FOUP 80a to be transported is placed, the process of transporting the FOUP 80a mounted on the shelf 111d to a predetermined shelf (in the present embodiment, the shelf 141 of the opener 140) in the loader 100 (or substrate transfer unit) of the present embodiment will be described.

As described, the transport robot 130 is movable slidably in the X-Z plane. Therefore, in order to transport the FOUP 80a to the shelf 141 of the opener 140 along a transport path AR6, the shelf 121c on which the FOUP 80b is placed first needs to be moved upwardly/downwardly by the corresponding cylinder 127c to ensure the transport path AR6.

It should be noted that, before starting the process of transporting the FOUP 80a, the shelves 121 (121a to 121e) are each located by the corresponding cylinder 127 such that the shelf 121a is at substantially the same height as the shelf 111b, shelf 121b at substantially the same height as the shelf 111c, shelf 121c at substantially the same height as the shelf 111d, shelf 121d at substantially the same height as the shelf 111e, shelf 121e at substantially the same height as the shelf 111f. None of the shelves 121 is located at substantially the same height as the uppermost shelf 111a. In short, the shelves are located at the same height to each other except the uppermost shelf of the first receiving section 110.

Figure 5:
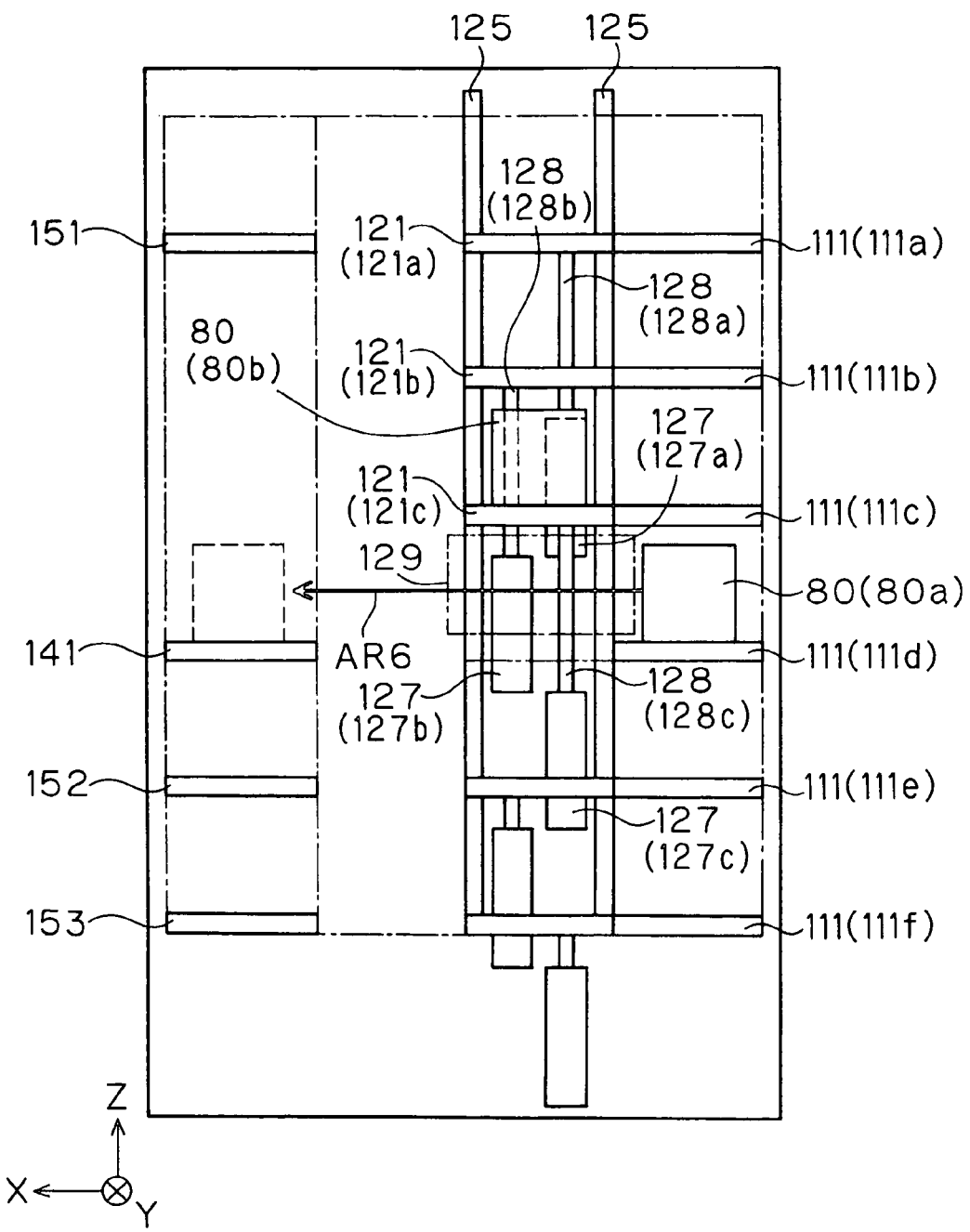

First, air pressure within a cylinder 127a is adjusted to extend a movable part 128a along the Z axis, thereby moving the shelf 121a to such a height substantially the same as the shelf 111a of the first receiving section 110. Similarly, a cylinder 127b is driven to move the shelf 121b to substantially the same height as the shelf 111b, and a cylinder 127c is driven to move the shelf 121c upwardly to reach substantially the same height as the shelf 111c (FIG. 5).

The FOUP 80b located at substantially the same height as the FOUP 80a is accordingly moved above the FOUP 80a, so that a space 129 is created at substantially the same height as the FOUP 80a. That is, the cylinders 127 (127a to 127c) are respectively activated to move the shelves 121 (121a to 121c)

upwardly, thereby creating the space 129 in the second receiving section 120 having a height at least greater than the height of the FOUP 80a. The transport path AR6 for transporting the FOUP 80a is thereby ensured.

In the loader 100, as described above, the number of shelves 121 of the second receiving section 120 is less by one than that of the shelves 111 of the first receiving section 110, so that there is a place where none of the shelves 121 is located horizontally adjacent to one of the shelves 111.

Accordingly, the second receiving section 120 has a virtual shelf-less part that cannot mount the FOUP 80 thereon because of the absence of shelf 121. Each of the shelves 121 is moved upwardly/downwardly by the corresponding cylinder 127, so that the shelf-less part is moved within the positions of the shelves 111a to 111f.

In other words, the first and second receiving sections 110 and 120 of the present embodiment are formed as a two-dimensional array of shelves where the plurality of shelves 111 and 121 each for mounting the FOUP 80 thereon are arrayed in a matrix in the vertical direction and along the X axis (or a first horizontal direction) as matrix cells in a lattice. The cylinders 127 corresponding to the shelves 121 are moved upwardly/downwardly to move the position of the shelf-less part. Therefore, moving the space of the shelf-less part, i.e., the space that cannot receive any FOUP 80, in the vertical direction can ensure the transport path utilizing the space of the shelf-less part.

As a result, unlike the conventional apparatus, the FOUP 80a can be transported without moving the FOUP 80b to another shelf.

Further, according to the present embodiment, the transport robot 130 transports the FOUP 80a to a predetermined shelf only with a movement in the X-Z plane through the space 129 without detouring along the Y axis (or a second horizontal direction). This leads to improved throughput of substrate processing in the substrate processing apparatus 1 while maintaining the footprint of the loader 100. Therefore, the use of the loader 100 according to the present embodiment does not create the problem that the loader increases in footprint.

Next, the transport arm 138 are moved to the position below the shelf 111d. FIG. 6 is a top view illustrating the positional relationship between the shelf 111d and transport arm 138 as moved to the position below the shelf 111d. As shown in FIG. 6, the shelf 111d has a notch 112d of substantially the same shape as the holding part 139 which is a leading edge of the transport arm 138.

Accordingly, the transport arm 138 is moved in the vertical direction to adjust the position thereof along the Z axis so as to be positioned below the shelf 111d, i.e., so as to have its top surface positioned below the lower surface of the shelf 111d, as well as to adjust the position thereof along the X axis by the horizontal driver 135 such that the holding part 139 of the transport arm 138 is positioned directly below the notch 112d of the shelf 111d. Then, the transport arm 138 is moved upwardly from directly below the notch 112d along the rail 137. The FOUP 80a mounted on the shelf 111d is thereby held by the transport arm 138 without causing interference between the shelf 111d and transport arm 138. The upward movement of the transport arm 138 is stopped at such a position that the lower surface of the transport arm 138 along the Z axis is above the top surface of the shelf 111d along the Z axis.

Subsequently, the FOUP 80a is moved by the horizontal driver 135 in the horizontal direction through the wide space 129 which is the shelf-less part to such a position that the holding part 139 of the transport arm 138 is located directly above a notch of the shelf 141 of the opener 140, where the horizontal driver 135 is stopped.

Thereafter, the transport arm 138 is moved downwardly. At this time, the transport arm 138 is moved downwardly through the notch of the shelf 141 similarly when holding the FOUP 80a at the shelf 111d. Therefore, the FOUP 80a is mounted on the upper surface of the shelf 141 without causing interference between the transport arm 138 and shelf 141.

<1.4. Advantages of Substrate Processing Apparatus>

As described, even in the case where the FOUPs 80a and 80b are respectively mounted on the shelf 111d of the first receiving section 110 and shelf 121c of the second receiving section 120 adjacent to each other as shown in FIG. 4, the substrate processing apparatus 1 of the first preferred embodiment can ensure the transport path AR6 for the FOUP 80a utilizing the space 129 by moving the shelves 121 (121a to 121c) by the corresponding cylinders 127 (127a to 127c) in the vertical direction, so that the FOUP 80a can be transported to a predetermined shelf without moving the FOUP 80b to another shelf as in the conventional apparatus. This can reduce the time required for transporting the FOUP 80a as compared to the conventional apparatus, achieving improved throughput of substrate processing.

Figure 11:
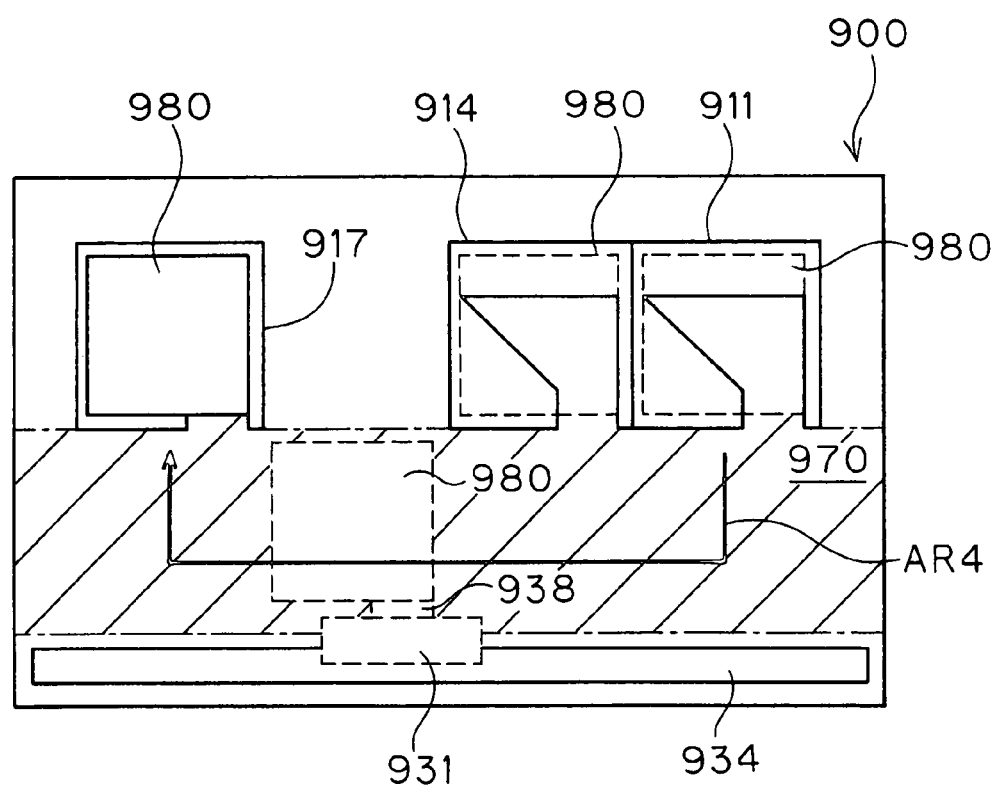

Further, the substrate processing apparatus 1 of the present embodiment can transport the FOUP 980 to a predetermined shelf without detouring as in the loader 900 shown in FIG. 11. This eliminates the need to provide the region 970 for detouring the transport robot 930 as in the loader 900, preventing the problem that the loader increases in footprint.

Second Preferred Embodiment

Figure 7:
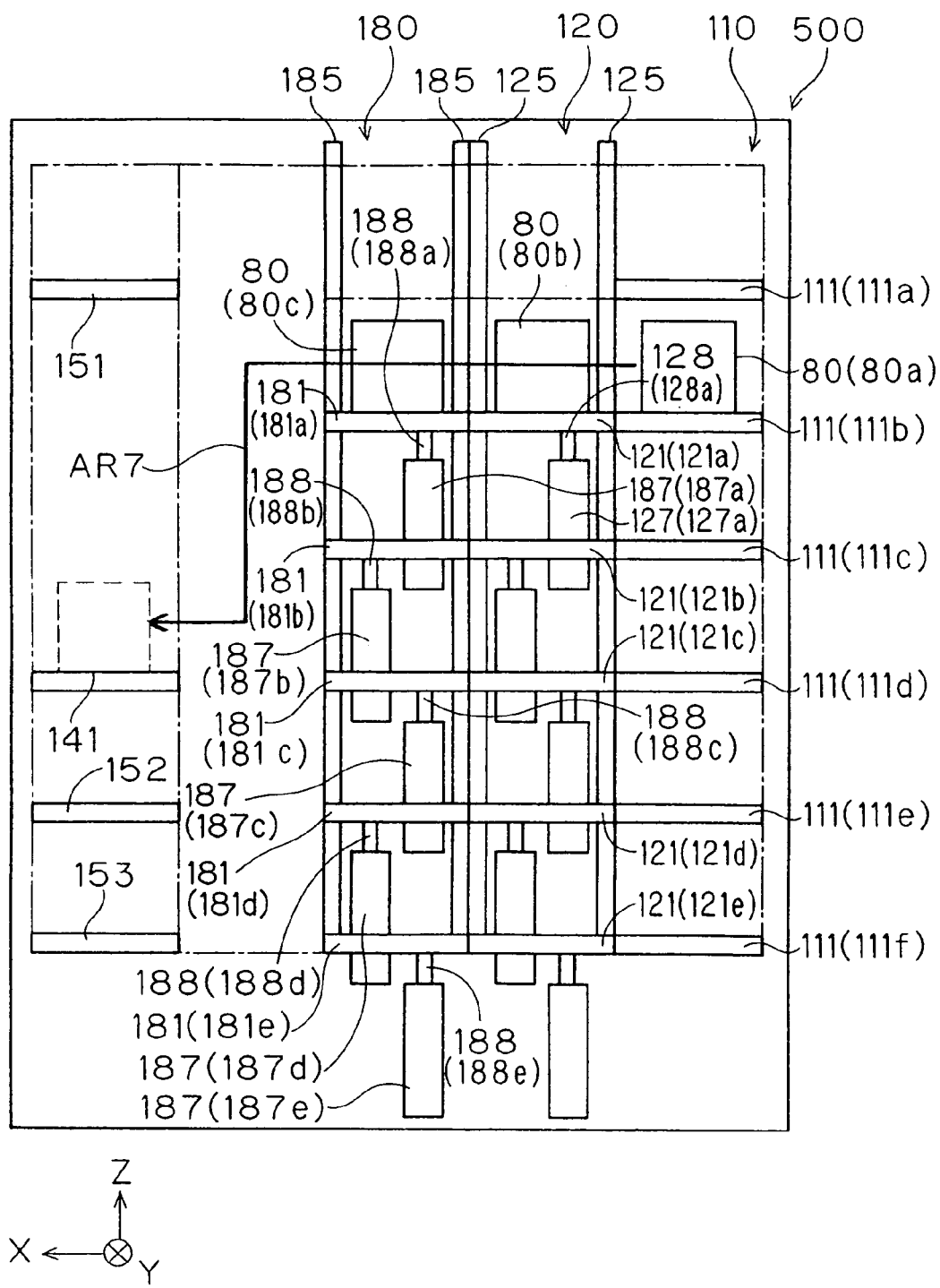
FIGS. 7 and 8 are front views illustrating the construction of receiving sections according to a second preferred embodiment of the present invention.
Figure 8:
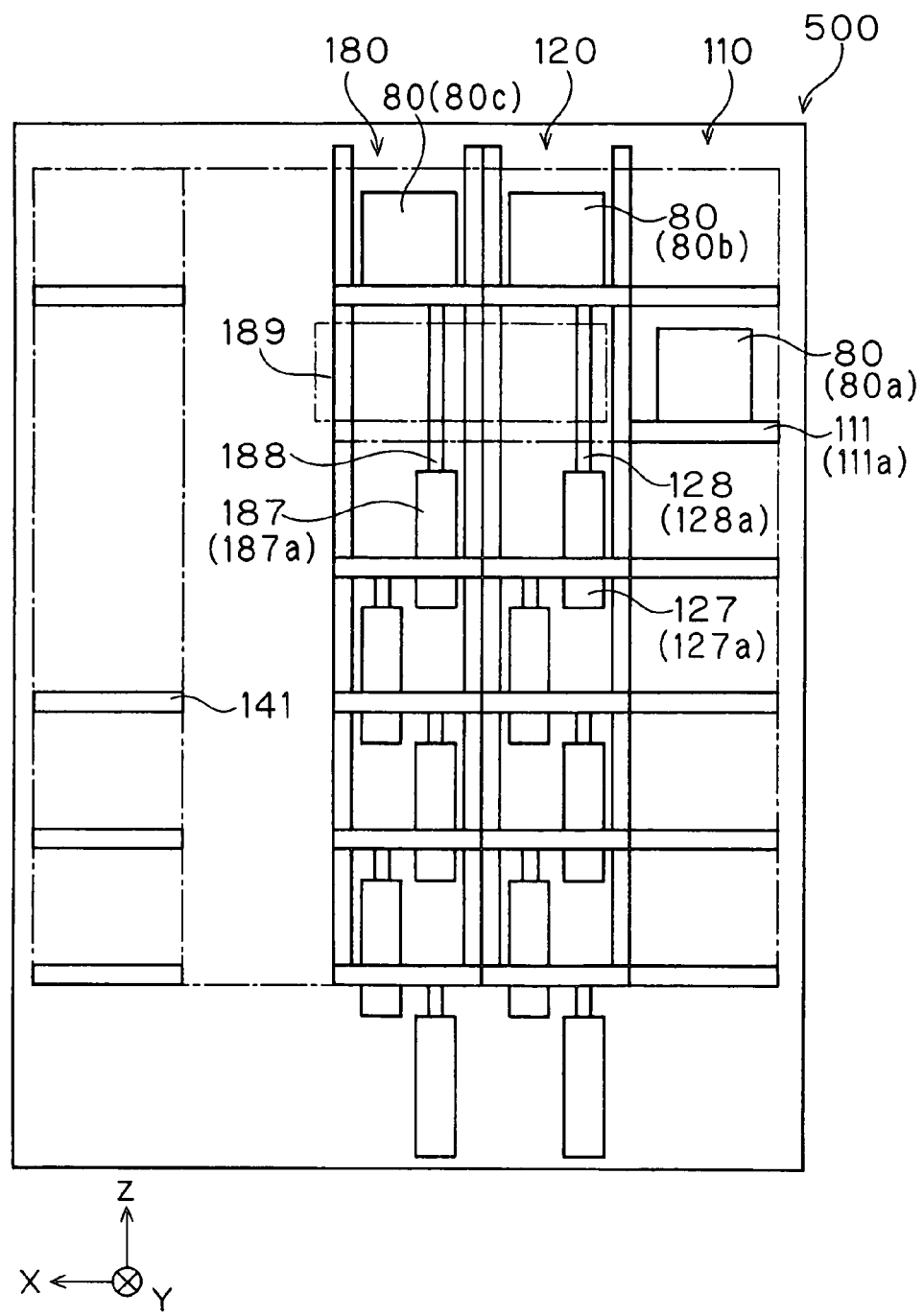
Figure 9:
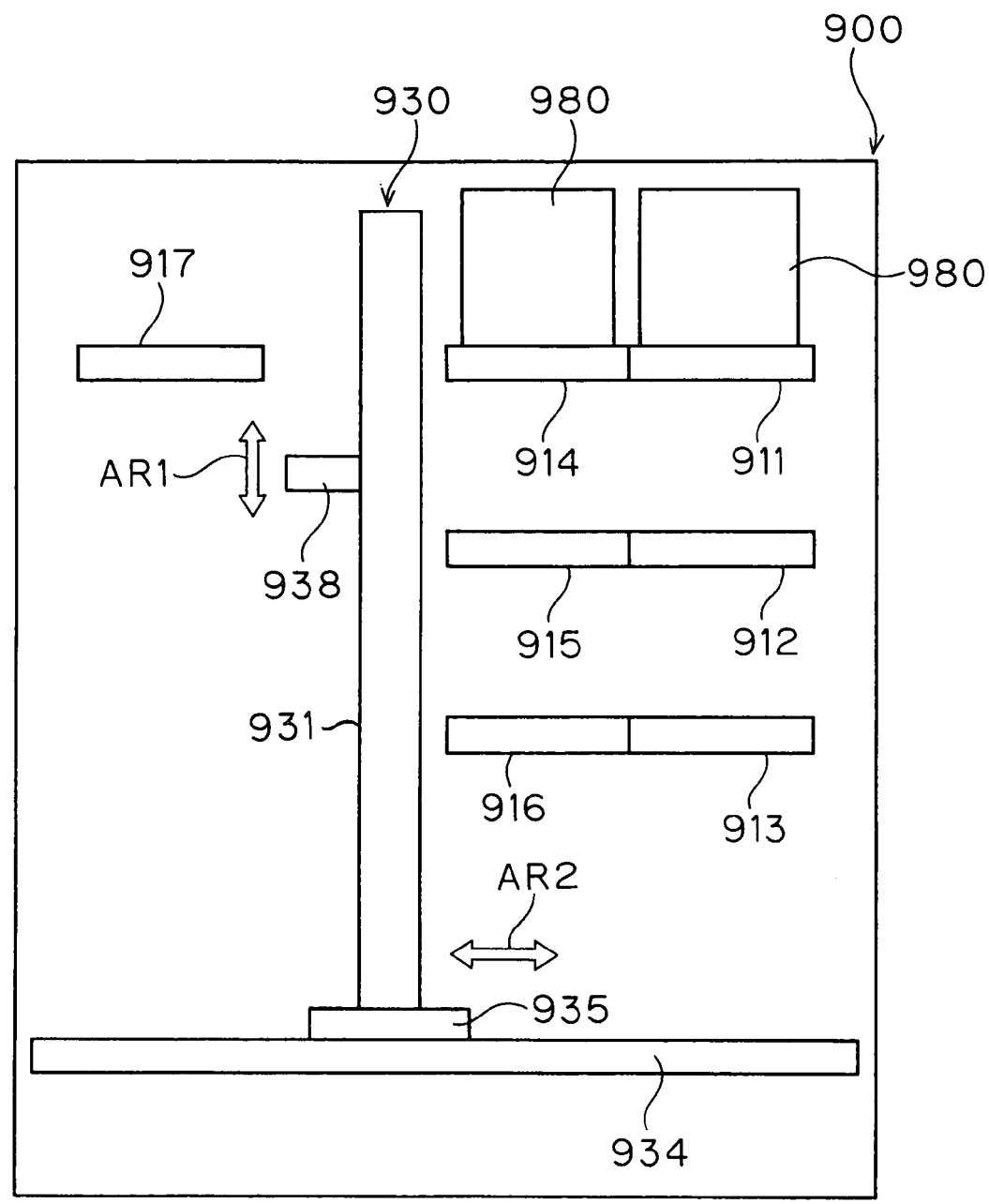
FIG. 9 is a schematic front view illustrating the construction of a substrate processing apparatus using conventional FOUPs.
Figure 10:
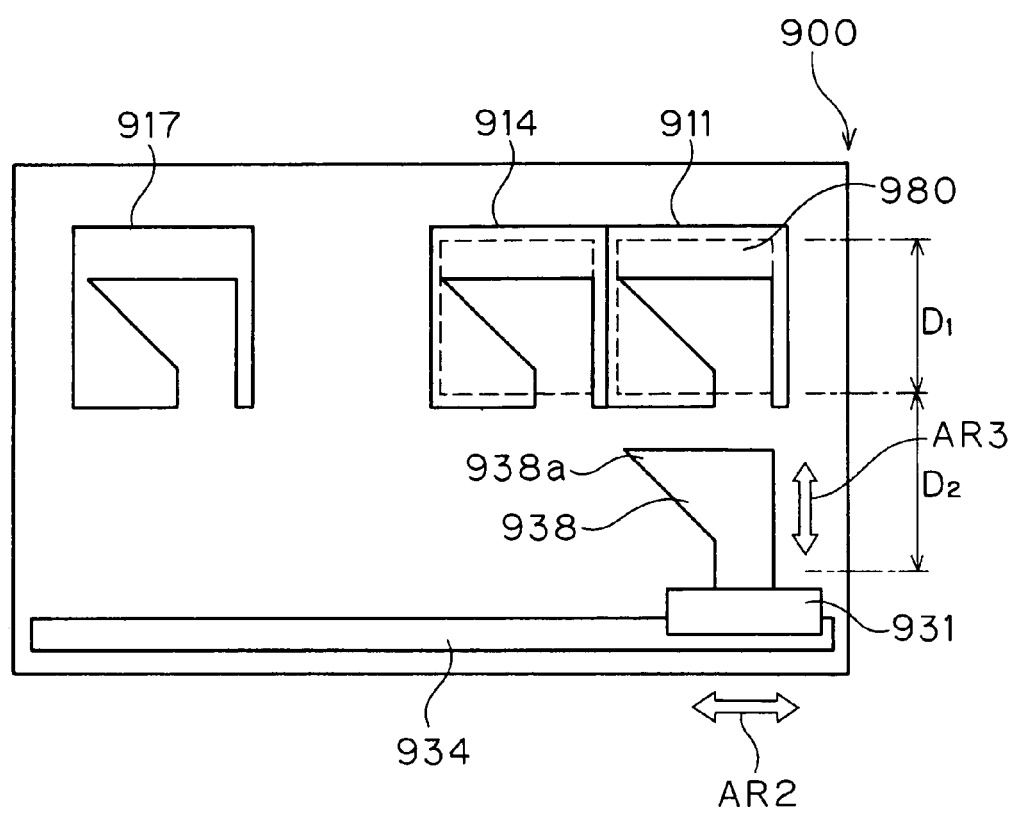
FIGS. 10 and 11 are schematic top views illustrating the construction of the substrate processing apparatus using the conventional FOUPs.

FIGS. 7 and 8 illustrate a loader 500 according to a second preferred embodiment. The loader 500 has the same hardware structure as the loader 100 of the first preferred embodiment except an additionally provided third receiving section 180. Therefore, the present embodiment will concentrate on this difference.

Similar components as those in the loader 100 of the first preferred embodiment are indicated by the same reference numerals. These components indicated by the same reference numerals have already been described in the first preferred embodiment, explanation of which is thus omitted in the present embodiment.

<2.1. Construction of Substrate Transfer Unit>

As shown in FIG. 7, the loader 500 of the present embodiment includes the third receiving section 180 in addition to the first and second receiving sections 110 and 120 provided for the loader 100. The third receiving section 180 has a group of shelves (shelf line) constituted by a plurality of (in the present embodiment, five) shelves 181 (181a to 181e) stacked in a line in the vertical direction (or along the Z axis). The third receiving section 180 is arranged on the opposite side of the side surface 100a with respect to the first receiving section 110 and between the second receiving section 120 and opener 140 along the X axis (or in the horizontal direction).

The shelves 181 (181a to 181e) are each intended for mounting a FOUP 80 on its upper surface, and each can receive either of the FOUP 80 with unprocessed substrates stored therein and the empty FOUP 80 out of which substrates have been removed.

As shown in FIG. 7, each of the shelves 181 has its bottom vertically connected to a cylinder 187 (187a to 187e) to be moved upwardly/downwardly via a movable part 188 (188a to 188e) which is extensible at least by the length equal to or greater than the height of the FOUP 80. Therefore, the amount of vertical displacement of each of the shelves 181 is set to be at least equal to or greater than the height of the FOUP 80, i.e., substantially equal to the interval among the shelves 111 in the vertical direction.

Further, each of the shelves 181 is movable slidably on a pair of guide rails 185 in the vertical direction (or along the Z axis). The interval among the shelves 181 is set to be at least greater than the height of the FOUP 80.

Therefore, air pressure within the air cylinder 187 is adjusted to move the corresponding movable part 188 upwardly/downwardly, thereby moving each of the shelves 181 individually in the vertical direction (or along the Z axis) to displace the shelves 181 in the vertical direction, similarly to the shelves 121.

That is, the guide rails 185 and cylinders 187 respectively connected to the bottom of each of the plurality of shelves 181 serve as a displacing mechanism for displacing at least part of the shelves 181 in the vertical direction. In other words, each of the shelves 181 of the third receiving section 180 momentarily hold the FOUP 80 thereon until transported to a predetermined shelf while moving the FOUP 80 mounted on each of the shelves 181 upwardly/downwardly.

The number of shelves 181 of the third receiving section 180 (in the present embodiment, five) is less by one than that of the shelves 111 in the first receiving section 110 (in the present embodiment, six). Accordingly, each of the shelves 181 is moved upwardly/downwardly by the corresponding cylinder 187 to individually move on the guide rails 185. The shelves 181 are thereby located such that none of the shelves 181 is at substantially the same height as one of the shelves 111 from which the FOUP 80 is to be transported.

Further, the cylinder 187 connected to the bottom of each of the shelves 181 has an amount of displacement substantially equal to the interval among the shelves 111 of the first receiving section 110 as described above. Accordingly, the uppermost shelf 181a of the third receiving section 180 moves between the positions of the shelves 111a and 111b of the first receiving section 110, while the lowermost shelf 181e of the third receiving section 180 moves between the positions of the shelves 111e and 111f of the first receiving section 110. Therefore, the shelves 181 of the third receiving section 180 move upwardly/downwardly within the height of the shelves 111 of the first receiving section 110, i.e., between the positions of the shelves 111a and 111f.

The present embodiment has described that the cylinders 187 are used to move the corresponding shelves 181 in the vertical direction, however, the present invention is not limited thereto, but various publicly-known mechanisms such as a feed screw mechanism with a ball screw used therein may be employed.

<2.2. Process of Transporting FOUP>

Referring now to the case in which FOUPs 80 (80a, 80b, 80c) are mounted on the shelf 111b of the first receiving section 110, shelf 121a of the second receiving section 120 and shelf 181a of the third receiving section 180, respectively, as shown in FIG. 7, and which the shelf 111b is selected as a target shelf on which the FOUP 80a to be transported is placed, the process of transporting the FOUP 80a mounted on the shelf 111b to a predetermined shelf (in the present embodiment, the shelf 141 of the opener 140) in the loader 500 (or substrate transfer unit) of the present embodiment will be described.

It should be noted that, before starting the process of transporting the FOUP 80a, the shelves 121 (121a to 121e) are located by the corresponding cylinders 127 such that the shelf 121a is at substantially the same height as the shelf 111b, shelf 121b at substantially the same height as the shelf 111c, shelf 121c at substantially the same height as the shelf 111d, shelf 121d at substantially the same height as the shelf 111e, shelf 121e at substantially the same height as the shelf 111f. None of the shelves 121 is located at substantially the same height as the uppermost shelf 111a. In short, the shelves 111 and 121 of the first and second receiving sections 110 and 120 are located at the same height to each other except the uppermost shelf of the first receiving section 110.

Similarly, the shelves 181 (181a to 181e) are located by corresponding cylinders 187 such that the shelf 181a is at substantially the same height as the shelf 111b, shelf 181b at substantially the same height as the shelf 111c, shelf 181c at substantially the same height as the shelf 111d, shelf 181d at substantially the same height as the shelf 111e, shelf 181e at substantially the same height as the shelf 111f. None of the shelves 181 is located at substantially the same height as the uppermost shelf 111a. In short, the shelves 111 and 181 of the first and third receiving sections 110 and 180 are located at the same height to each other except the uppermost shelf of the first receiving section 110.

First, air pressure within the cylinder 127a is adjusted to extend the movable part 128a along the Z axis, thereby moving the shelf 121a to such a height substantially the same as the shelf 111a of the first receiving section 110. Similarly, air pressure within the cylinder 187a is adjusted to activate the cylinder 187a to move the movable part 188a along the Z axis, thereby moving the shelf 181a upwardly to reach substantially the same height as the shelf 111a (FIG. 8).

The FOUPs 80b and 80c located at substantially the same height as the FOUP 80a are accordingly moved above the FOUP 80a, so that a space 189 is created at substantially the same height as the FOUP 80a. That is, the cylinders 127a and 187a are activated to move upwardly the shelves 121a and 181a, respectively, thereby creating the space 189 having a height at least greater than the height of the FOUP 80a which causes the second and third receiving sections 120 and 180 to communicate with each other. A transport path AR7 for transporting the FOUP 80a is thereby ensured.

In the loader 500, as described above, the number of shelves 121 of the second receiving section 120 is less by one than that of the shelves 111 of the first receiving section 110, so that there is a place where none of the shelves 121 is located horizontally adjacent to one of the shelves 111.

Accordingly, the second receiving section 120 has a first virtual shelf-less part that cannot mount the FOUP 80 thereon because of the absence of shelf 121. The respective shelves 121 are moved upwardly/downwardly by the corresponding cylinders 127 to move the first shelf-less part within the positions of the shelves 111a to 111f.

Similarly, the number of the shelves 181 of the third receiving section 180 is less by one than that of the shelves 111 of the first receiving section 110, so that there is a place where none of the shelves 181 is located horizontally adjacent to one of the shelves 111. Accordingly, the third receiving section 180 has a second virtual shelf-less part that cannot mount thereon the FOUP 80 because of the absence of shelf 181. The respective shelves 181 are moved upwardly/downwardly by the corresponding cylinders 187 to move the second shelf-less part within the positions of the shelves 111a to 111f.

In other words, the first to third receiving sections 110, 120 and 180 of the present embodiment are formed as a two-dimensional array of shelves where the plurality of shelves 111, 121 and 181 each for mounting the FOUP 80 thereon are arrayed in a matrix in the vertical direction and along the X axis (or the first horizontal direction) as matrix cells in a lattice. The cylinders 127 corresponding to the shelves 121 are moved upwardly/downwardly to move the position of the first shelf-less part, while the cylinders 187 corresponding to the shelves 181 upwardly/downwardly to move the position of the second shelf-less part. Therefore, moving the space of the first and second shelf-less parts, i.e., the space that cannot receive any FOUP 80, in the vertical direction can ensure the transport path utilizing the space of the shelf-less parts.

As a result, unlike the conventional apparatus, the FOUP 80a can be transported without moving the FOUPs 80b and 80c to other shelves.

Further, according to the present embodiment, the transport robot 130 (FIG. 3) transports the FOUP 80a to a predetermined shelf only with a movement in the X-Z plane through the space 189 without detouring along the Y axis (or the second horizontal direction). Thus, providing the three groups of shelves or three receiving sections 110, 120 and 180 in the loader 500 will not increase the loader 500 in size along the Y axis (or in the second horizontal direction) but achieves improved throughput of substrate processing.

Similarly to the first preferred embodiment, the transport arm 138 moves to the shelf 111a to hold the FOUP 80a thereon, and then transports the FOUP 80a to the shelf 141 to place it on the upper surface of the shelf 141.

<2.3. Advantages of Substrate Processing Apparatus>

As described, even in the case where the FOUPs 80a, 80b and 80c are respectively mounted on the shelf 111b of the first receiving section 110, shelf 121b of the second receiving section 120 and shelf 181a of the third receiving section 180 adjacent to one another as shown in FIG. 7, the substrate processing apparatus 1 of the second preferred embodiment can ensure the transport path AR7 for the FOUP 80a utilizing the space 189 by moving the shelves 121a and 181a by the corresponding cylinders 127a and 187a, respectively, in the vertical direction. Therefore, even in the case where a plurality of receiving sections (in the present embodiment, the second and third receiving sections 120 and 180) each having displacing mechanisms are provided, the FOUP 80a can be transported to a predetermined shelf without moving the FOUPs 80b and 80c to other shelves. This achieves improved throughput of substrate processing.

Further, additionally providing the third receiving section 180 increases the number of FOUPs 80 the loader 500 can receive, so that the number of substrates the loader 500 can receive increases.

3. Modification

Although the preferred embodiments of the present invention have been described above, the present invention is not limited to the above examples.

The first preferred embodiment has described that the plurality of shelves 111 of the first receiving section 110 are fixed to the partition 155 and the plurality of shelves 121 of the second receiving section 120 are moved in the vertical direction by the cylinders 127 to create the space 129, thereby ensuring the transport path AR6, however, the present invention is not limited thereto, but the shelves 111 of the first receiving section 110 may be made movable in the vertical direction with respect to the shelves 121 of the second receiving section 120 to create a space for ensuring a transport path.

Similarly, the second preferred embodiment may be modified such that the shelves 111 of the first receiving section 110 are movable in the vertical direction with respect to the plurality of shelves 121 of the second receiving section 120 and the plurality of shelves 181 of the third receiving section 180.

As described, in the case of creating the space 129 according to the first preferred embodiment or space 189 according to the second preferred embodiment, at least one of a shelf on which the FOUP 80 to be transported is placed (e.g., the shelf 111 of the first receiving section) and a shelf on which the FOUP 80 to be transported is not placed (e.g., the shelf 121 of the second receiving section 120 or the shelf 181 of the third receiving section 180) may be moved relative to the other, for displacing the shelves in the vertical direction.

Further, the first and second preferred embodiments have described, by way of example, that the FOUP 80a mounted on a predetermined shelf of the first receiving section 110 is transported to the shelf 141 of the opener 140, however, the present invention is not limited thereto, but another shelf may be selected as a shelf to which the FOUP 80a is to be transported.

Although the second preferred embodiment has described the process of transporting the FOUP 80a mounted on the shelf 111b of the first receiving section 110, the FOUP 80b mounted on the shelf 121a of the second receiving section 120 may be transported. In this case, the shelf 181a is moved in the vertical direction by the cylinder 187a to move the FOUP 80c above the FOUP 80b, thereby creating a space in the third receiving section 180, so that a transport path utilizing the space is ensured.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus comprising:
a substrate processing unit for performing a predetermined process on a substrate; and
a substrate transfer unit for holding a container for storing substrates therein and transferring said substrates stored in said container to said substrate processing unit, wherein
said substrate transfer unit includes:
a mounting part for mounting said container on a fixed shelf to transfer said substrates stored in said container to said substrate processing unit;
a first shelf line containing a plurality of first shelves arranged in a vertical direction at a first predetermined interval, each being capable of mounting said container thereon;
a second shelf line provided between said mounting part and said first shelf line and containing a plurality of second shelves arranged in the vertical direction at a second predetermined interval, each being capable of mounting said container thereon;
a displacing element having a plurality of displacing mechanisms, each of said plurality of displacing mechanisms being connected to a corresponding single second shelf on said second shelf line, and being configured to displace the corresponding single second shelf in the vertical direction;
a transport element for transporting said container; and
a control unit configured to form a container transport path greater than said second predetermined interval in said second shelf line by displacing at least one of said plurality of second shelves in the vertical direction by said displacing element, said one of said plurality of second shelves corresponding to one of said plurality of first shelves which contains a container in said first shelf line, and configured to transport said container from said one of said plurality of first shelves to said fixed shelf in said mounting part by transporting said container through said container transport path in a horizontal direction by said transport element.

2. The substrate processing apparatus according to claim 1, wherein
said displacing element is connected to at least part of said plurality of second shelves for displacing said at least part of said plurality of second shelves in the vertical direction.

3. The substrate processing apparatus according to claim 1, wherein
the number of shelves in said second shelf line is less than that of shelves in said first shelf line in the vertical direction, and
displacement of said plurality of second shelves is performed by said displacing element within the height of said first shelf line in the vertical direction.

4. The substrate processing apparatus according to claim 3, wherein
the number of shelves in said second shelf line is less by one than that of shelves in said first shelf line in the vertical direction, and
the amount of displacement of each of said plurality of second shelves performed by said displacing element corresponds to said second predetermined interval.

* * * * *